US007692440B2

(12) United States Patent
Chew et al.

(10) Patent No.: US 7,692,440 B2
(45) Date of Patent: Apr. 6, 2010

(54) HANDLER FOR SEMICONDUCTOR SINGULATION AND METHOD THEREFOR

(75) Inventors: Jimmy Hwee Seng Chew, Singapore (SG); Kok Yeow Lim, Hillington Green (SG); Fulin Liu, Singapore (SG)

(73) Assignee: Advanced Systems Automation Limited, Singapore (SG)

( * ) Notice: Subject to any disclaimer, the term of this patent is extended or adjusted under 35 U.S.C. 154(b) by 442 days.

(21) Appl. No.: 10/533,236

(22) PCT Filed: Aug. 29, 2003

(86) PCT No.: PCT/SG03/00204

§ 371 (c)(1),
(2), (4) Date: Oct. 18, 2005

(87) PCT Pub. No.: WO2004/040639

PCT Pub. Date: May 13, 2004

(65) Prior Publication Data

US 2006/0094339 A1 May 4, 2006

(30) Foreign Application Priority Data

Oct. 29, 2002 (SG) ................................ 200206560

(51) Int. Cl.
*G01R 31/26* (2006.01)
*B26D 7/06* (2006.01)
*B24C 3/32* (2006.01)

(52) U.S. Cl. ............................ 324/765; 83/434; 451/78

(58) Field of Classification Search ....................... None
See application file for complete search history.

(56) References Cited

U.S. PATENT DOCUMENTS

| | | | | |
|---|---|---|---|---|
| 5,566,877 | A * | 10/1996 | McCormack | 348/126 |
| 6,250,990 | B1 * | 6/2001 | Yoshii et al. | 451/5 |
| 6,305,261 | B1 * | 10/2001 | Romanini | 83/53 |
| 6,341,740 | B2 * | 1/2002 | Sekiya et al. | 83/704 |
| 6,392,433 | B2 * | 5/2002 | Itasaka et al. | 324/765 |
| 6,612,910 | B1 * | 9/2003 | Hirano et al. | 451/78 |
| 6,676,485 | B1 * | 1/2004 | Quirke et al. | 451/75 |
| 7,047,857 | B2 * | 5/2006 | Adkins | 83/549 |

(Continued)

FOREIGN PATENT DOCUMENTS

EP 1028455 A2 * 8/2000

(Continued)

*Primary Examiner*—Jermele M Hollington
(74) *Attorney, Agent, or Firm*—Conley Rose, P.C.

(57) ABSTRACT

A water jet handler (200) has a loading location (205), a cutting location (210), and an unloading location (215); and two movable mounts (240 and a 245). As a first movable mount (240) receives a molded substrate at the loading location (205), and transports it to the cutting location (210), a second movable mount (245) transports singulated semiconductor packages of a previously singulated molded substrate from the cutting location (210) to the unloading location (215). As the molded substrate on the first movable mount (240) is cut in the X direction (232) by a water jet, the singulated semiconductor packages are unloaded. The molded substrate is then transferred to the second movable mount (245) on which it is cut in the Y direction (272) to produce singulated semiconductor packages, as the first movable mount (240) returns to the loading location (205), when another molded substrate is loaded.

29 Claims, 12 Drawing Sheets

U.S. PATENT DOCUMENTS

| | | | | |
|---|---|---|---|---|
| 2001/0043076 | A1* | 11/2001 | Itasaka et al. | 324/765 |
| 2002/0073575 | A1* | 6/2002 | Na | 34/236 |
| 2006/0090622 | A1* | 5/2006 | Adkins | 83/549 |
| 2006/0137504 | A1* | 6/2006 | Nishio et al. | 83/875 |
| 2009/0124178 | A1* | 5/2009 | Ueyama et al. | 451/91 |

FOREIGN PATENT DOCUMENTS

| | | | | |
|---|---|---|---|---|
| JP | 53078165 | A | * | 7/1978 |
| JP | 03149183 | A | * | 6/1991 |
| JP | 09162270 | A | * | 6/1997 |
| JP | 2001060566 | A | * | 3/2001 |
| WO | WO 0235585 | A1 | * | 5/2002 |

* cited by examiner

HANDLER FOR SEMICONDUCTOR SINGULATION AND METHOD THEREFOR

FIELD OF THE INVENTION

The present invention relates to a handler for semiconductor singulation and more particularly to a handler for semiconductor singulation, where singulation is performed with a water jet system.

This application is a 371 of PCT/SG03/00204 filed on Aug. 29, 2003.

BACKGROUND OF THE INVENTION

As is known, when packaging integrated circuits (IC), multiple semiconductor dies are arranged on a single substrate. The silicon dies are first bonded to paddles of the substrate or leadframe by a die bonder, interconnecting wires are wire bonded between the dies and conductors on the substrate. Alternatively, flip-chip processes can be used to flip a semiconductor die over and attach the pads on the dies directly to the conductors on the substrate. The dies on the substrate are then packaged, such as by encapsulation in mold compound, and the molded substrate is then cut to produce a number of singulated semiconductor packages, each having a die encapsulated therein. The process of cutting up the molded substrate is often referred to as singulation.

Typically, the molded substrate is singulated using one or more rotating dicing saws that cut the molded substrate first along an X axis, and then along a Y axis. A saw jig with an applied vacuum force, holds the molded substrate against a rubber pad, prior to and, during singulation, and the vacuum also holds the singulated semiconductor packages on the rubber pad after singulation.

As semiconductor dies shrink in size, semiconductor packages have also been reducing in size, an example of which is the Quad Flat No-lead (QFN) semiconductor package. When the rotating saw is employed to singulate QFN packages from a molded substrate, several difficulties arise in relation to securing the molded substrate and singulated QFN packages during and after singulation, and in relation to the quality of the cut that is obtained.

The rotating saw is a contact cutting process, which exerts considerable lateral forces on the molded substrate during cutting. The vacuum force on the molded substrate, and indeed on each of the individual packaged semiconductor dies, must be greater than the lateral force to prevent the individual packaged semiconductor dies from moving, or worst yet, from being thrown off the saw jig.

When the size of the individual packaged semiconductor die is reduced, the holding force on it also reduces, however the lateral force during cutting remains substantially the same, which compounds the difficulty in securing the individual packaged semiconductor dies. Hence, a disadvantage of the rotating saw is the difficulty in securing the individual packaged semiconductor dies during cutting.

As saw cutting is a contact process, the molded substrate and the resultant singulated packaged semiconductor dies are subjected to considerable mechanical forces during cutting. Hence, another disadvantage of using the rotating sawing, is the risk of damage to the dies in the singulated semiconductor packages, which can adversely affect reliability.

Some semiconductor packages, such as the QFN package, include copper portions, which are thicker than the copper portions in other types of semiconductor package, such as a ball grid array (BGA) package. The thicker copper portions are both more difficult to cut through, and smear and burr on the semiconductor packages when the rotating saw is used for singulation.

Hence, another disadvantage of using the rotating saw is the difficulty in cutting through the copper portions, without smearing and burring on the individual packaged semiconductor dies.

One alternative to sawing is laser singulation, which is a non-contact process. A laser beam cuts the molded substrate by burning and evaporating material from the substrate. However, the wavelength of the laser beam is selected by the object material, and for composite material like the molded substrate with copper and mold compound, the laser absorbing rates for copper and mold compound are very different. Therefore, a disadvantage of laser singulation is that it is difficult for the energy from the laser beam to be efficiently absorbed by both the copper and mold compound, and thus, it is difficult for the laser beam to cut through the package material.

Another method of singulating semiconductor packages employs a water jet to cut the molded substrate. Water jet cutting is a non-contact process, which uses a jet of water to cut through the molded substrate. The jet of water comprises a stream of extremely high pressure water with an entrained stream of abrasive particles. Water jet cutting is cool, and possesses a low risk of heat and mechanical damage to both the molded substrate and the resultant singulated semiconductor packages. In addition, there are limited restrictions on the material that can be cut by a water jet. Further, as the cutting force is perpendicular to the surface of the molded substrate, there is little resultant lateral force on the molded substrate and the resultant singulated semiconductor packages. Hence, the force required to secure the singulated semiconductor packages is lower than that in sawing. In addition, the cutting quality of the water jet is good and stable, with no burring and smearing.

Unlike the sawing or laser cutting which use one vacuum jig for securing the molded substrate during cutting, a prior art water jet handler uses two vacuum jigs to hold the molded substrate. This is because the extremely high pressure of the water jet cuts through almost any material within about 300 mm from the nozzle that provides the water jet. Consequently, there is a need to ensure a certain amount of clearance or relief for the water jet, behind the molded substrate.

The prior art water jet handler has a movable chuck table with two vacuum jigs, one with relief slots in the X direction, and the other with relief slots in the Y direction. The chuck table can move in the X and Y directions, and can rotate about a vertical axis, which is parallel to the water jet. Rotation about a vertical axis is often referred to as displacement in the theta direction. All the movements of the chuck table is relative to the position of the water jet nozzle.

With reference to FIG. 1, a molded substrate for singulation is loaded onto a first vacuum jig at a loading location, and secured to the first vacuum jig by an applied vacuum. The chuck table then moves the first vacuum jig to a cutting location below the nozzle of the water jet, where a vision system operates with the chuck table to align the molded substrate with a cutting line of the water jet system. The molded substrate is then cut in the X direction as the chuck table transports the molded substrate transversely across the water jet in the X direction. For multiple cuts in the X direction, the operation as described is repeated. Next, the molded substrate, which has been cut in the X direction, is transferred from the first vacuum jig onto a second vacuum jig, and secured by an applied vacuum. A second vision alignment is performed, and the molded substrate is cut in the Y direction, as the chuck table transports the molded substrate transversely across the water jet. This operation is repeated for each cut in the Y direction. The individual packaged semiconductor dies are now individually held on the second vacuum jig, and the chuck table moves the second vacuum jig to the loading location, where the individual packaged semiconductor dies are unloaded. This process is repeated for each molded substrate.

A disadvantage of the prior art water jet handler is low efficiency, as only one molded substrate is sequentially processed at a time by the handler, and actual cutting of the molded substrate is performed for only part of the sequential process. Hence, the throughput of the handler is low.

In addition, as the prior art water jet handler loads a molded substrate and unloads the singulated molded substrate at the same loading/unloading location, the prior art water jet handler is not suited for integration with in-line manufacturing operations, where equipment are arranged in sequence. In addition, the low throughput of the handler will adversely affect the throughput of the in-line manufacturing operations.

BRIEF SUMMARY OF THE INVENTION

The present invention seeks to provide a handler for semiconductor singulation and method therefor, which overcomes, or at least reduces, the above mentioned problems of the prior art.

Accordingly, in one aspect, the present invention provides a handler for singulating at least one packaged substrate into a plurality of packaged semiconductor devices, the handler comprising:

a first movable mount for moving between a loading location and a cutting location, the first movable mount adapted to receive the at least one packaged substrate at the loading location, the first movable mount for transporting the at least one packaged substrate from the loading location to the cutting location, and the first movable mount adapted to secure the at least one packaged substrate thereon while the at least one packaged substrate is at least partially cut at the cutting location; and a second movable mount for moving between the cutting location and an unloading location, the second movable mount adapted to receive the at least one packaged substrate that is at least partially cut at the cutting location, the second movable mount for securing the at least one packaged substrate thereon while the at least one packaged substrate is at least partially cut at the cutting location to produce at least some of the plurality of packaged semiconductor devices, and the second movable mount for transporting the at least some of the plurality of packaged semiconductor devices from the cutting location to the unloading location.

In another aspect the present invention provides a method for handling at least one packaged substrate for singulation into a plurality of packaged semiconductor devices, the method comprising:

a) providing:

a first movable mount for moving between a loading location and a cutting location; and a second movable mount for moving between the cutting location and an unloading location, b) moving the first movable mount from the loading location to the cutting location with the at least one packaged substrate disposed thereon;

c) cutting the at least one packaged substrate in a first reference direction at the cutting location;

d) transferring the at least one packaged substrate from the first movable mount to the second movable mount;

e) cutting the at least one packaged substrate in a second reference direction, different from the first reference direction, at the cutting location, to produce the plurality of packaged semiconductor devices; and f) moving the second movable mount from the cutting location to the unloading location.

BRIEF DESCRIPTION OF THE DRAWINGS

An embodiment of the present invention will now be more fully described, by way of example, with reference to the drawings of which.

DETAIL DESCRIPTION OF THE DRAWINGS

A water jet handler in accordance with the present invention has three distinct spatially separated locations, which include a loading location, a cutting location, and an unloading location; and two movable mounts. A first movable mount receives a molded substrate at the loading location, transports it from the loading location to the cutting location, and secures the molded substrate as it is cut in the X direction by a water jet at the cutting location. The molded substrate is then transferred to a second movable mount at the cutting location, and the second movable mount secures the molded substrate as it is cut in the Y direction to produce singulated semiconductor packages. Concurrently, the first movable mount returns to the loading location, where another molded substrate is loaded. Next, the second movable mount transports the singulated semiconductor packages from the cutting location to the unloading location, while at the same time, the first movable mount, with the other molded substrate, moves from the loading location to the cutting location. Then, while the singulated semiconductor packages are unloaded from the second movable mount at the unloading location, the first movable mount secures the other molded substrate as it is cut in the X direction at the cutting location.

The handler in accordance with the present invention, as is described below, advantageously allows concurrent action to be performed, which improves throughput to become better than the sequential processing of the prior art handler. In addition, as the loading and unloading locations are separated, the handler can be more readily integrated in an in-line manufacturing operation.

Figure 1:
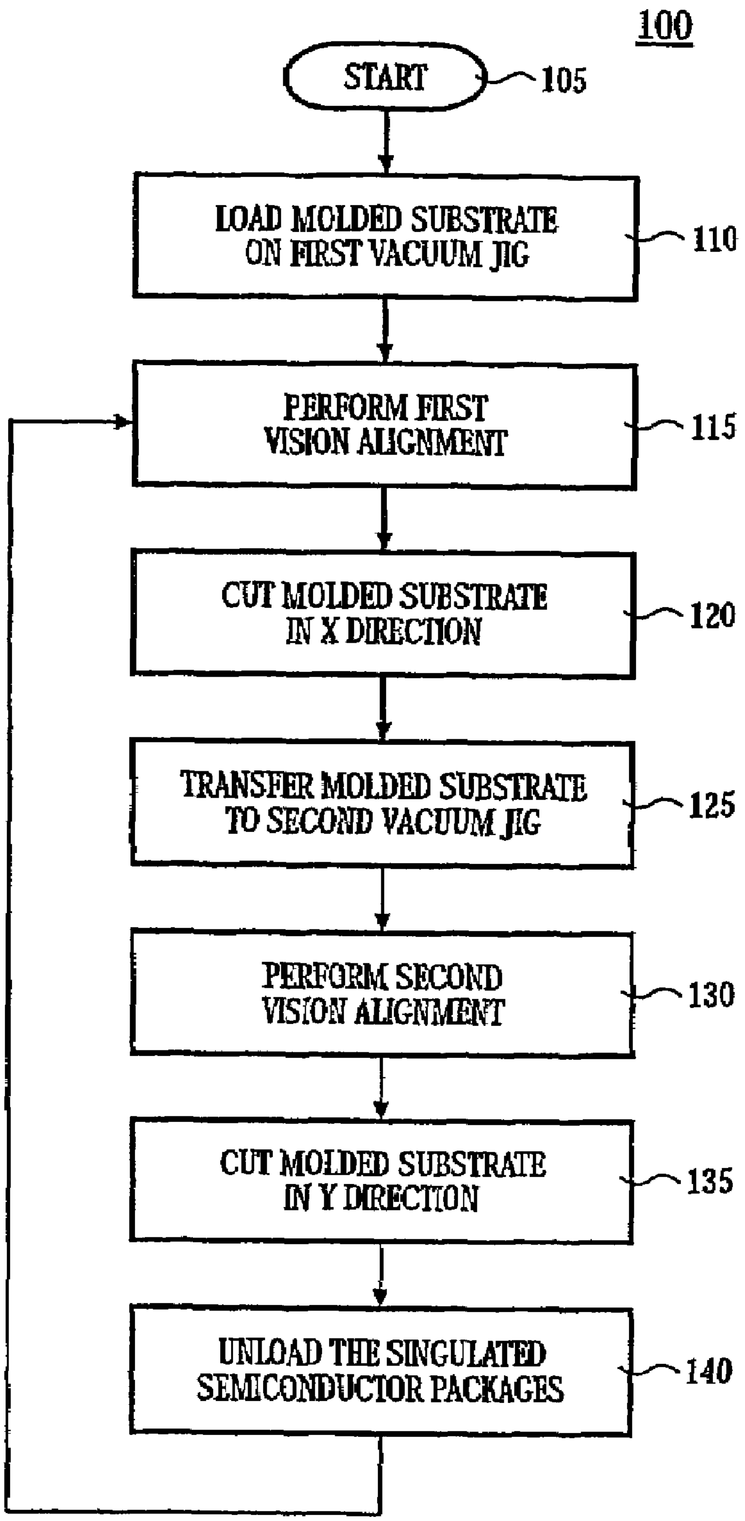
FIG. 1 (PRIOR ART)
FIG. 1 shows a flowchart detailing the operation of a water jet handler in accordance with the prior art.
Figure 2A:
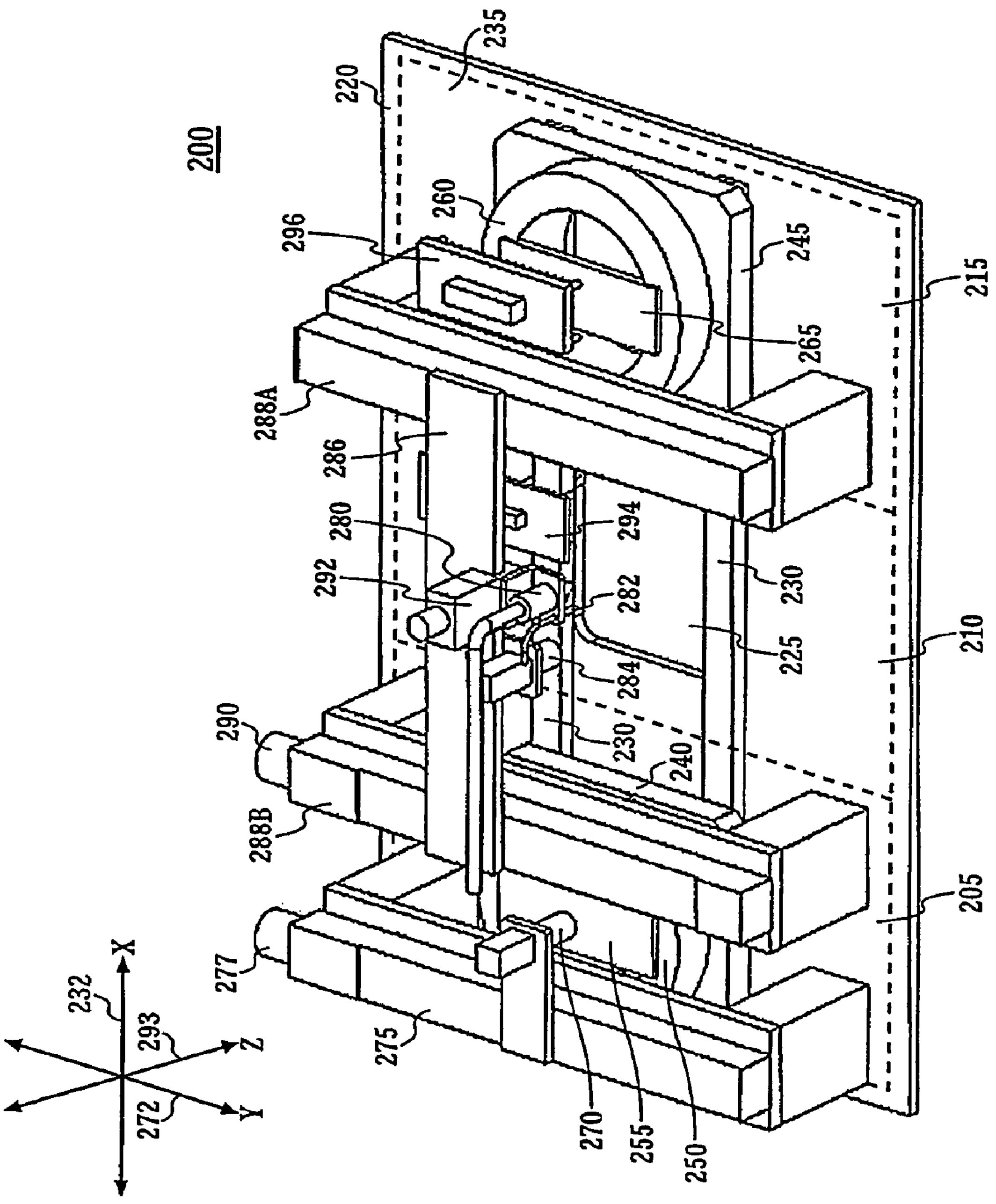
FIG. 2A shows a schematic of a water jet handler in accordance with present invention.
Figure 2B:
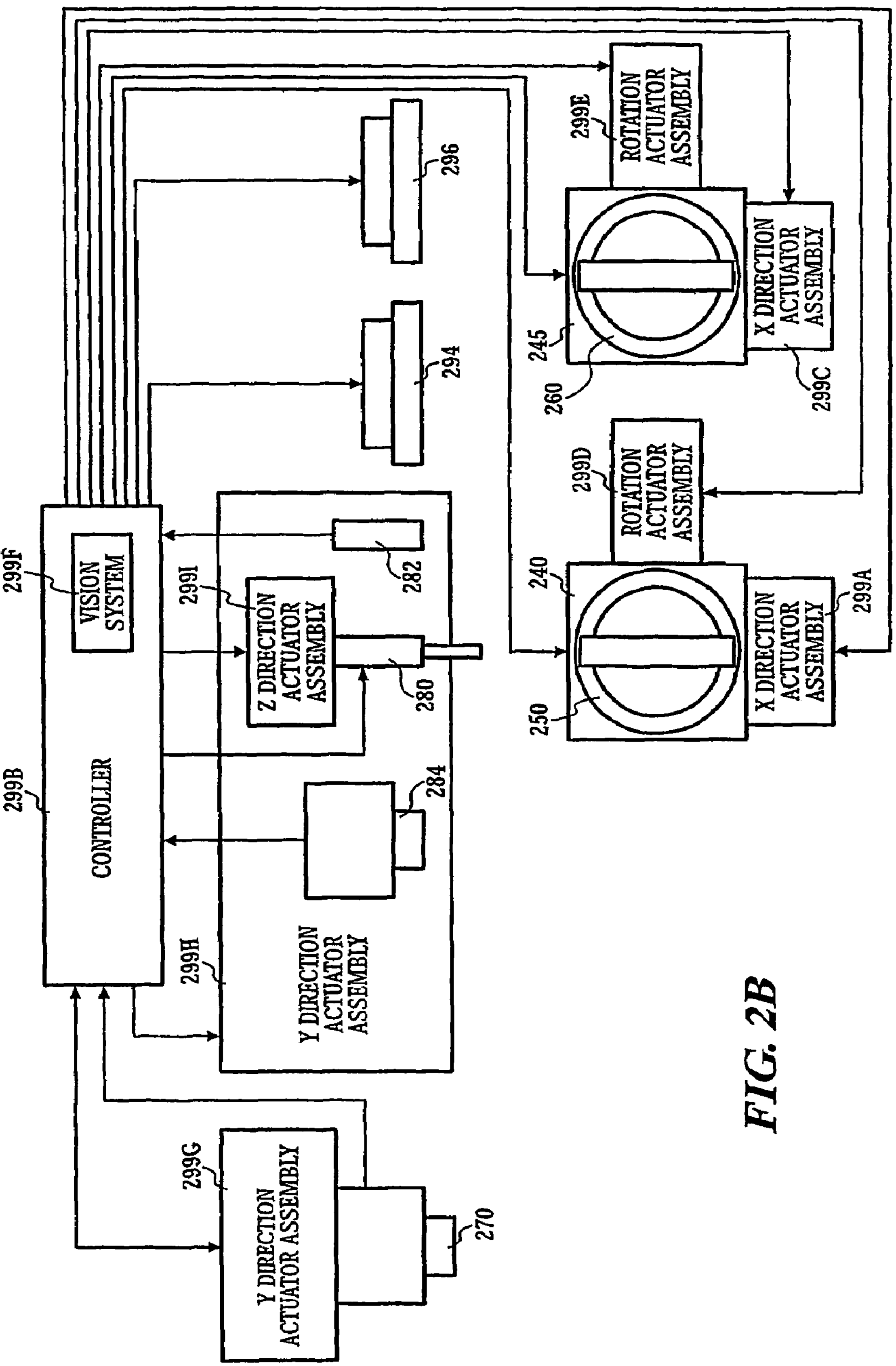
FIG. 2B shows a functional block diagram of the water jet handler in FIG. 2A.
Figure 3:
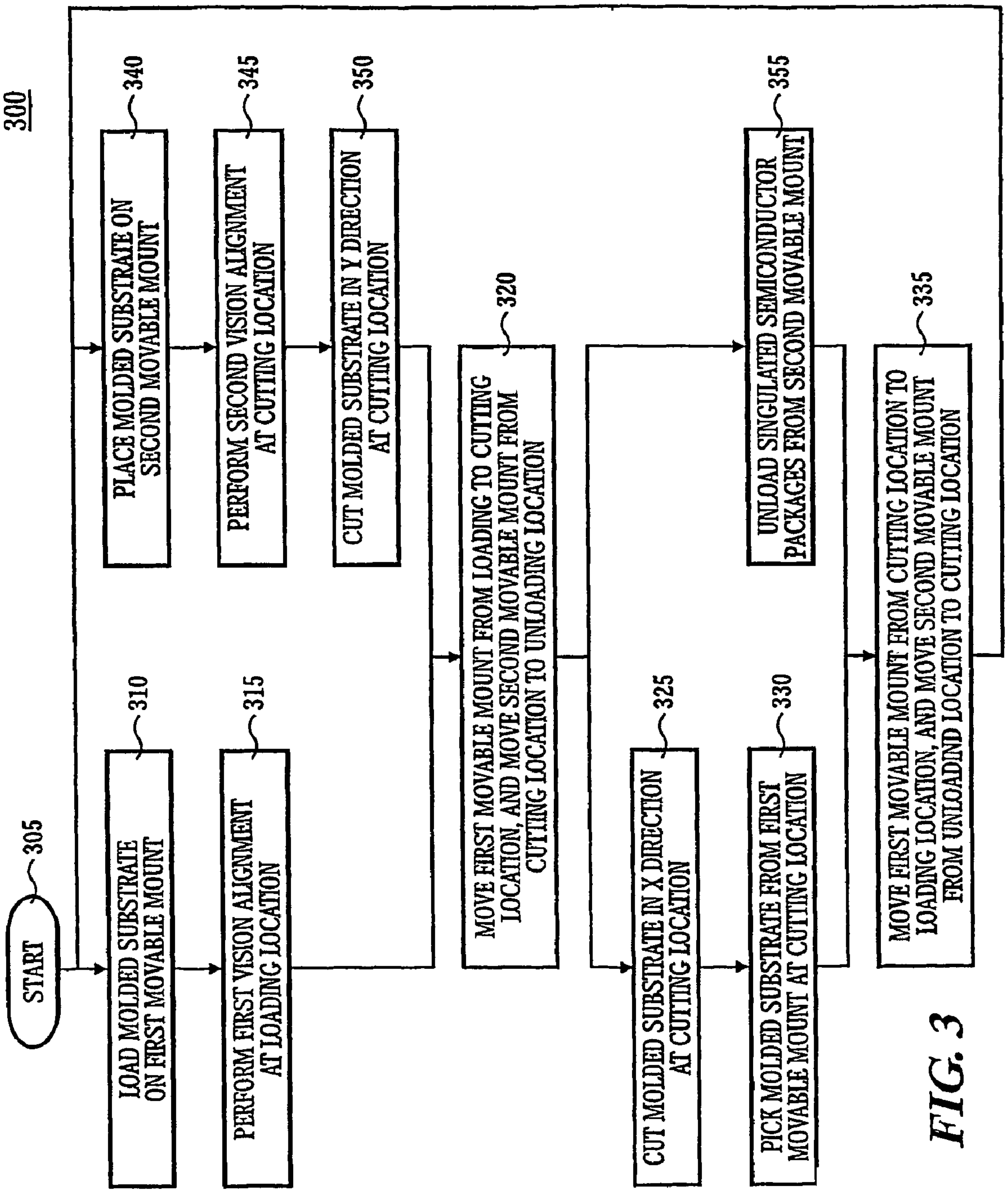
FIG. 3 shows a flowchart detailing the operation of the water jet handler in FIG. 2A.

With reference to FIGS. 2A and 2B, a water jet handler 200 has three locations: a loading location 205, a cutting location 210, and an unloading location 215. The three locations 205-215 are arranged in an in-line sequence adjacent to each other, with the loading location 205 at one end, the unloading location 215 at the opposite end, and the cutting location 210 between the two locations 205 and 215.

The water jet handler 200 comprises, a rectangular base plate 220 with the three locations 205-215 thereon. The base plate 220 has an opening 225 that is centrally located in the cutting location 210, and a pair of parallel table tracks 230 on the upper surface 235. The parallel table tracks 230 are centrally located on the base plate 220, and extend lengthwise from the loading location 205, through the cutting location 210, to the unloading location 215.

A first movable mount 240 is coupled to an X direction actuator assembly 299A, which moves the first movable mount 240 on the table tracks 230 in the X direction 232 between the loading location 205 and the cutting location 210. The X direction actuator assembly 299A is coupled to a controller 299B to receive movement instructions, that control the movement of the first movable mount 240 in the X direction 232.

Similarly, a second movable mount 245 is coupled to an X direction actuator assembly 299C, which moves the second movable mount 245 on the table tracks 230 in the X direction 232 between the cutting location 210 and the unloading location 215. The X direction actuator assembly 299C is also coupled to the controller 299B to receive movement instructions, which controls the movement of the second movable mount 245 in the X direction 232.

The first and second movable mounts 240 and 245 are moved independently by first and second servomotors (not shown), which form part of the X direction actuator assemblies 299A and 299C, respectively. In addition, when positioned at the cutting location 210, during cutting, the first and second movable mounts 240 and 245 move to and fro in the X direction 232, under the control of the controller 299B, to guide a water jet across the width or length of a molded substrate.

The first movable mount 240 includes a first rotatable section 250, with a first vacuum chuck 255, and the second movable mount 245 includes a second rotatable section 260, with a second vacuum chuck 265. Each of the first and second vacuum chucks 255 and 265, secures a molded substrate (not shown), cut portions of the molded substrate, and singulated semiconductor packages, thereon, when a vacuum is applied. The vacuum chucks 255 and 265 are both coupled to the controller 299B, which controls their operation.

The first rotatable section 250 is coupled to a rotation actuator assembly 299D, the second rotatable section 260 is coupled to a rotation actuator assembly 299E, and both the rotation actuator assembly 299D and 299E, are coupled to the controller 299B to receive rotation instructions therefrom, which support alignment of the molded substrate with the water jet.

The loading location 205 includes a first video camera 270 that is coupled to a vision system 299F, which forms part of the controller 299B. The first video camera 270 is mounted on a first Y direction actuator assembly 299G, which is coupled to the controller 299B. The first Y direction actuator assembly 299G comprises a first gantry 275 with a servomotor 277. The servomotor 277 moves the first video camera 270 in the Y direction 272 along the first gantry 275 to transport it to a desired position. The first video camera 270 is for directing at a molded substrate that is loaded on the first movable mount 240, when the first movable mount 240 is at the loading location 205.

In operation, the first video camera 270 captures images of the molded substrate at the loading location 205 as determined by the controller 299B, and provides the captured images to the vision system 299F. The vision system 299F processes the captured images to determine alignment of the molded substrate with a reference cutting line (not shown) of the water jet. The controller 299B then provides movement instructions to the X direction actuator assembly 299A and rotation instructions to the rotation actuator assembly 299D, to align the molded substrate with the reference cutting line.

At the cutting location 210, a water jet nozzle 280, a height detecting sensor or distance detector 282, and a second video camera 284, are mounted on a beam 286, which is supported on second and third gantries 288A and 288B. A servomotor 290, which is part of a Y direction actuator assembly 299H that is coupled to the controller 299B, moves the beam 286 in the Y direction 272 to a desired position, and thereby moves the water jet nozzle 280, the height detecting sensor 282, and the second video camera 284, in the Y direction 272, to a position determined by the controller 299B for alignment.

When the first movable mount 240 is in the cutting location 210, a molded substrate on the first movable mount 240 is positioned by the controller 299B, in accordance with the cutting line reference of the water jet based on alignment performed at the loading location 205, as described earlier. At the cutting location 210, the first movable mount 240 holds the molded substrate over the opening 225 to provide relief or clearance for the water jet during cutting. The water jet from the water jet nozzle 280 cuts the molded substrate, as the first movable mount 240 moves to and fro in the X direction 232 under the control of the controller 299B. In addition, the servomotor 290 moves the beam 286, and hence the jet nozzle 280, along the Y direction 272 from one cut to the next in the X direction 232. In this way, the water jet makes a plurality of widthwise cuts through the molded substrate in the X direction 232.

The height-detecting sensor 282 detects the distance between the water jet nozzle 280 and the molded substrate in the Z direction 293, and provides detected distance information to the controller 299B. In response, the controller 299B provides distance adjustment data to a vertical actuator 292. The vertical actuator 292 is part of a Z direction actuator assembly 299I, which adjusts the distance of the water jet nozzle 280 from the molded substrate to a predetermined distance i.e. in the Z direction 293, in accordance with adjusted distance received from the controller 299B. In this way, the distance between the water jet nozzle 280 and the molded substrate is maintained, substantially at the desired distance by the controller 299B.

A pick and place assembly 294 at the cutting location 210 is coupled to the controller 299B, and picks up the molded substrate from the first movable mount 240, after cutting of the molded substrate in the X direction 232 is completed. The first movable mount 240 then moves away from the cutting location 210, and the second movable mount 245 moves from the unloading location 215 to the cutting location 210. The pick and place assembly 294 then loads the molded substrate on the second movable mount 245, where a vacuum is applied to secure it to the second vacuum chuck 265. The second video camera 284, which is coupled to the vision system 299F, is for directing at the molded substrate on the first movable mount 240, when the first movable mount 240 is at the cutting location 210. Similar to the first video camera 270, in operation, the second video camera 284 captures images of the molded substrate at the cutting location 210, and provides the captured images to the vision system 299F. The vision system 299F then processes the captured images to determine alignment of the molded substrate with the reference cutting line of the water jet. The controller 299B then provides movement and rotation instruction to the X direction actuator assembly 299C and the rotation actuator assembly 299E. In response, the rotatable section 260 rotates the molded substrate to align with the reference cutting line of the water jet, thus achieving alignment.

At the cutting location 210, the second movable mount 245 holds the molded substrate over the opening 225 to provide relief or clearance for the water jet during cutting. As the water jet from the water jet nozzle 280, cuts the molded substrate, under the control of the controller 299B, the servo motor 290 moves the beam 286, and hence the jet nozzle 280, to and fro along the Y direction 272, and the second movable mount 245 steps from one cut to the next in the X direction 232. In this way, the water jet makes a plurality of lengthwise cuts through the molded substrate in the Y direction 272.

After the water jet has completed cutting, the second movable mount 245 moves from the cutting location to the unloading location 215, where another pick and place assembly 296, which is coupled to the controller 299B, unloads the now singulated semiconductor packages from the second movable mount 245.

With reference to FIG. 3, FIGS. 4A-H and FIGS. 5A-H, the operation 300 of the water jet handler 200 will now be described.

Figure 4A:
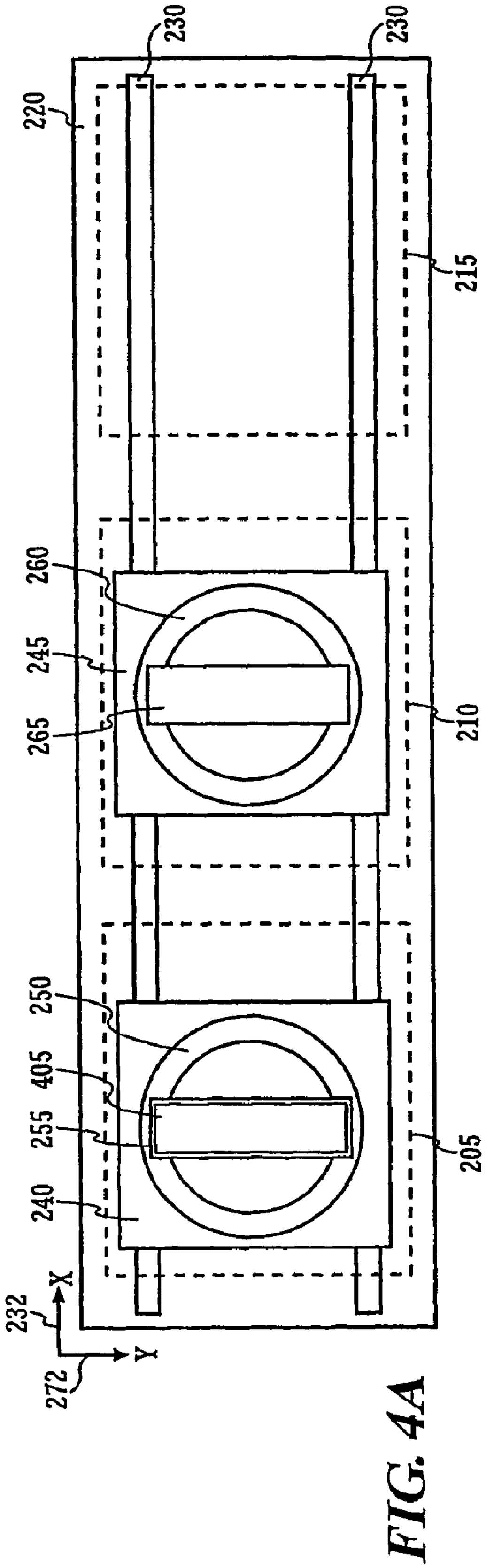
FIGS. 4A-4H show top views of the water jet handler in FIG. 2A when operating as detailed in FIG. 3.
Figure 5A:
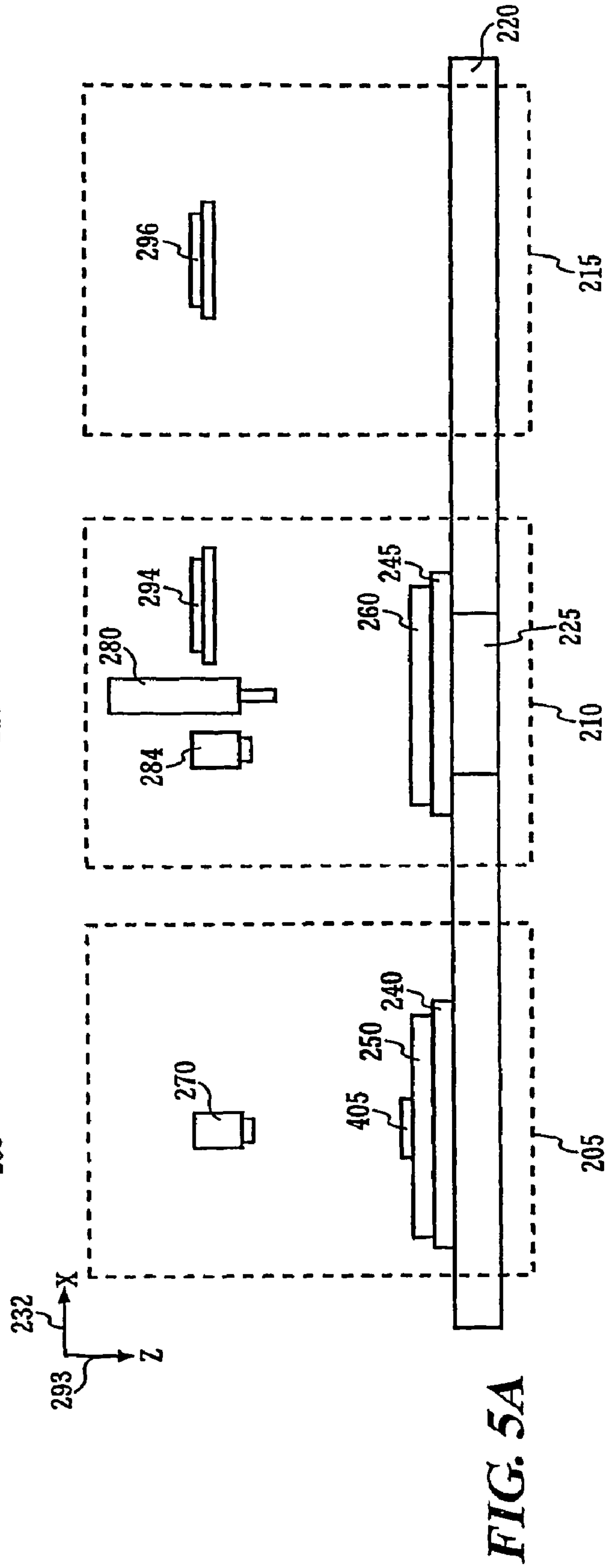
FIGS. 5A-5H show side views of the water jet handler in FIG. 2A when operating as detailed in FIG. 3.

Referring to FIGS. 4A and 5A, the operation 300 starts 305 when a first molded substrate 405 is loaded 310 on the first vacuum chuck 255 of the first movable mount 240; and an applied vacuum then secures the first molded substrate 405 thereon. Typically, a pick and place assembly (not shown) picks the first molded substrate 405 from a previous process, such as a molding machine, and places the first molded substrate 405 on the first vacuum chuck 255. A first vision alignment is then performed 315 on the first molded substrate 405 with images captured by the first video camera 270.

Figure 4B:
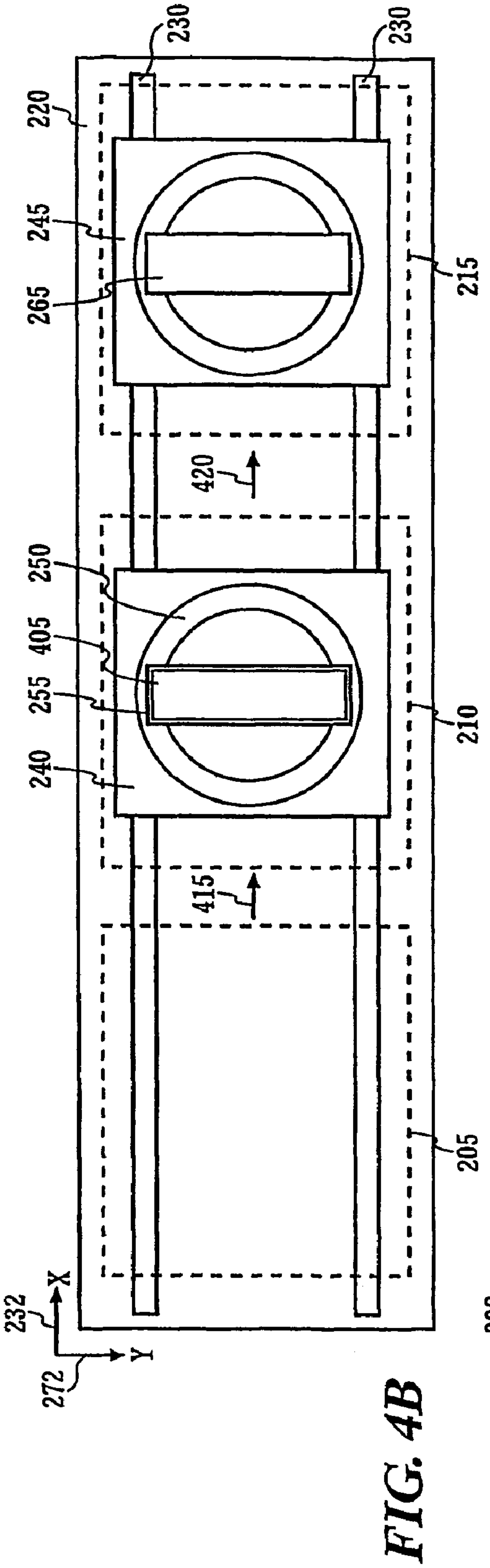
Figure 5B:
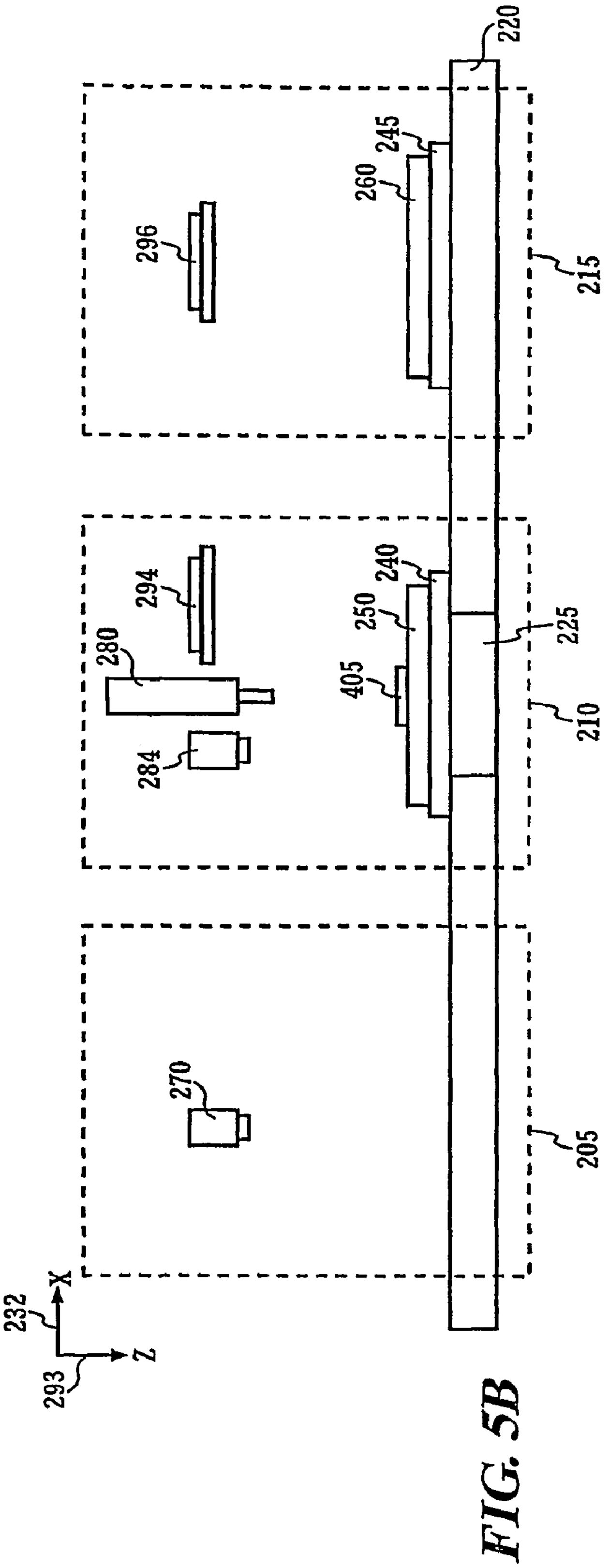

Referring to FIGS. 4B and 5B, when vision alignment is completed, the first movable mount 240 moves 320 from the loading location 205 to the cutting location 210, as indicated by arrow 415; and the second movable mount 245 moves 320 from the cutting location 210 to the unloading position 215, as indicated by arrow 420.

Figure 4C:
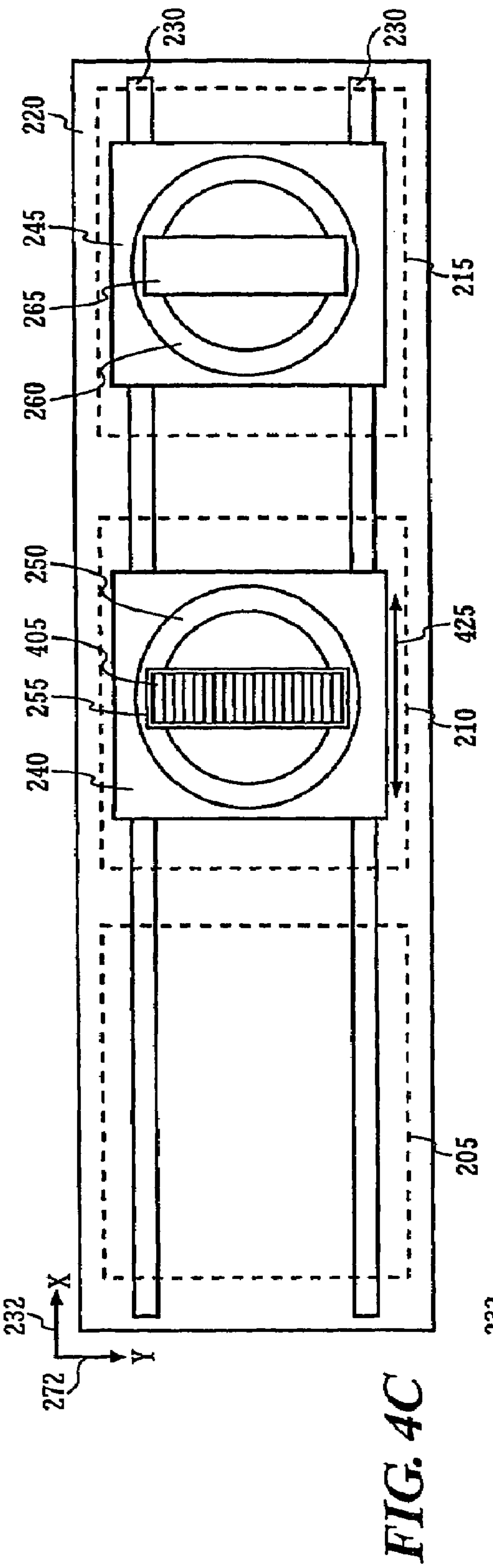
Figure 5C:
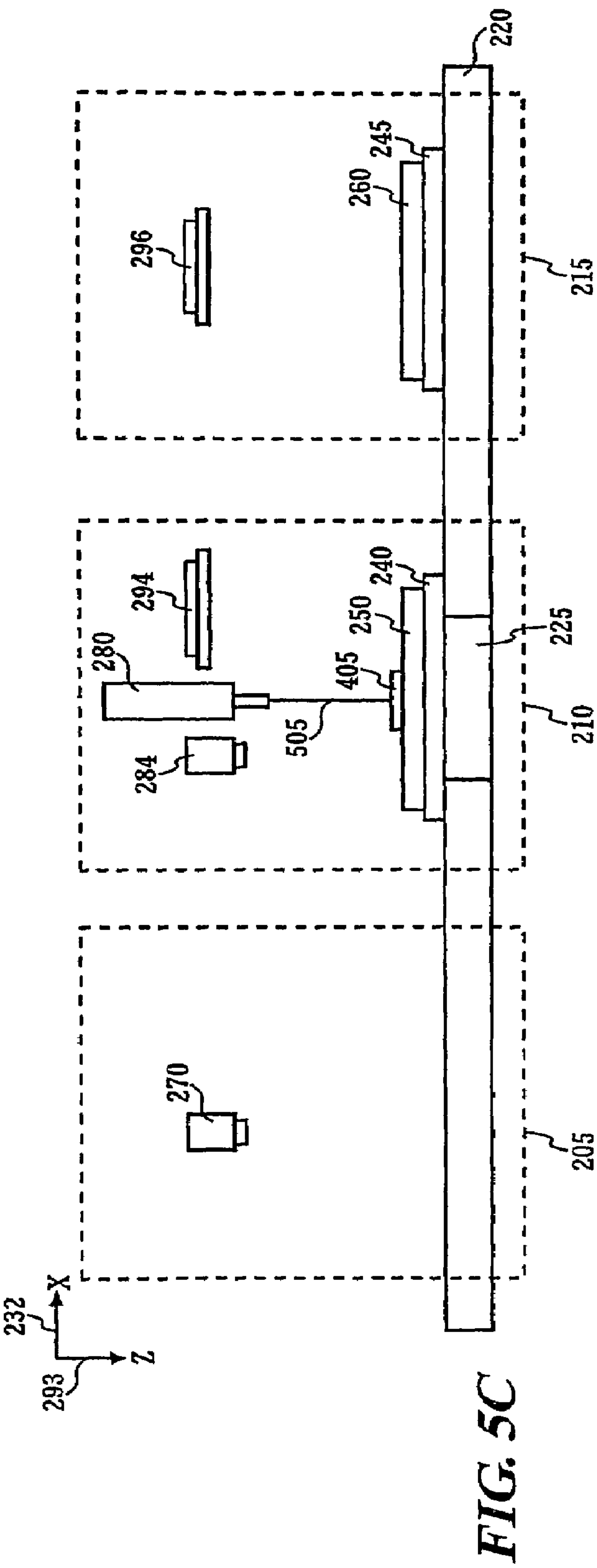

Referring to FIGS. 4C and 5C, a water jet 505 from the water jet nozzle 280 cuts 325 the first molded substrate 405 widthwise in the X direction 232, as the first movable mount 240 repeatedly moves to and fro in the X direction 232, as indicated by arrow 425. The servomotor 290 steps the water jet 505 in the Y direction 272, and cutting 325 by the water jet 505 proceeds until the whole of the first molded substrate 405 has been cut widthwise.

Figure 4D:
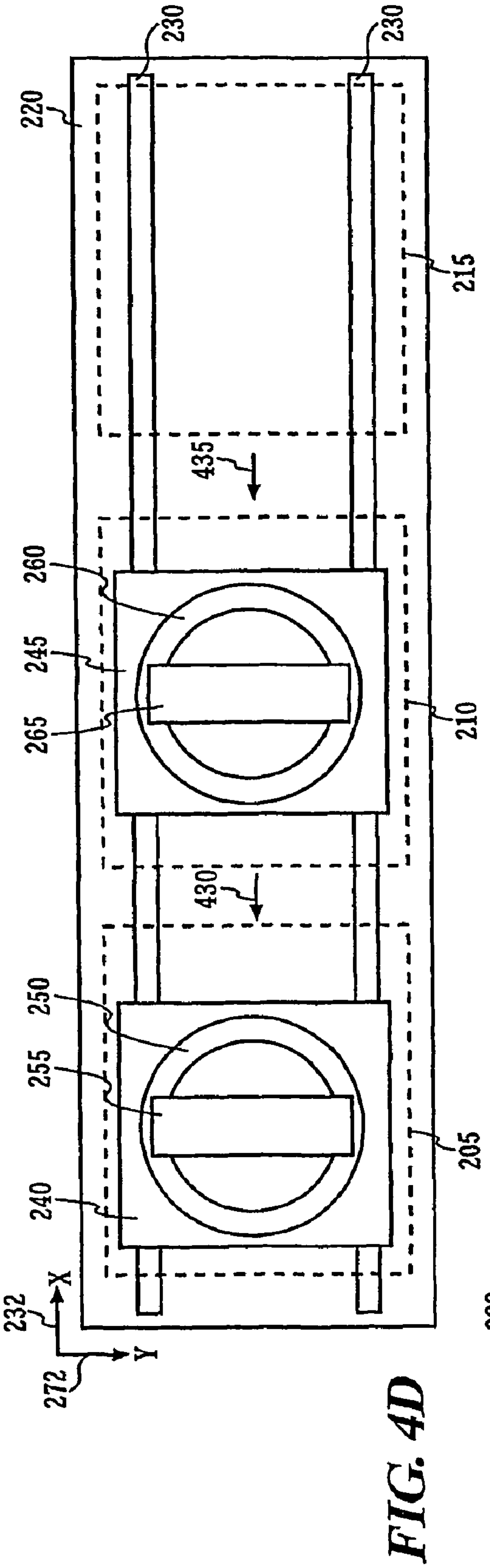
Figure 5D:
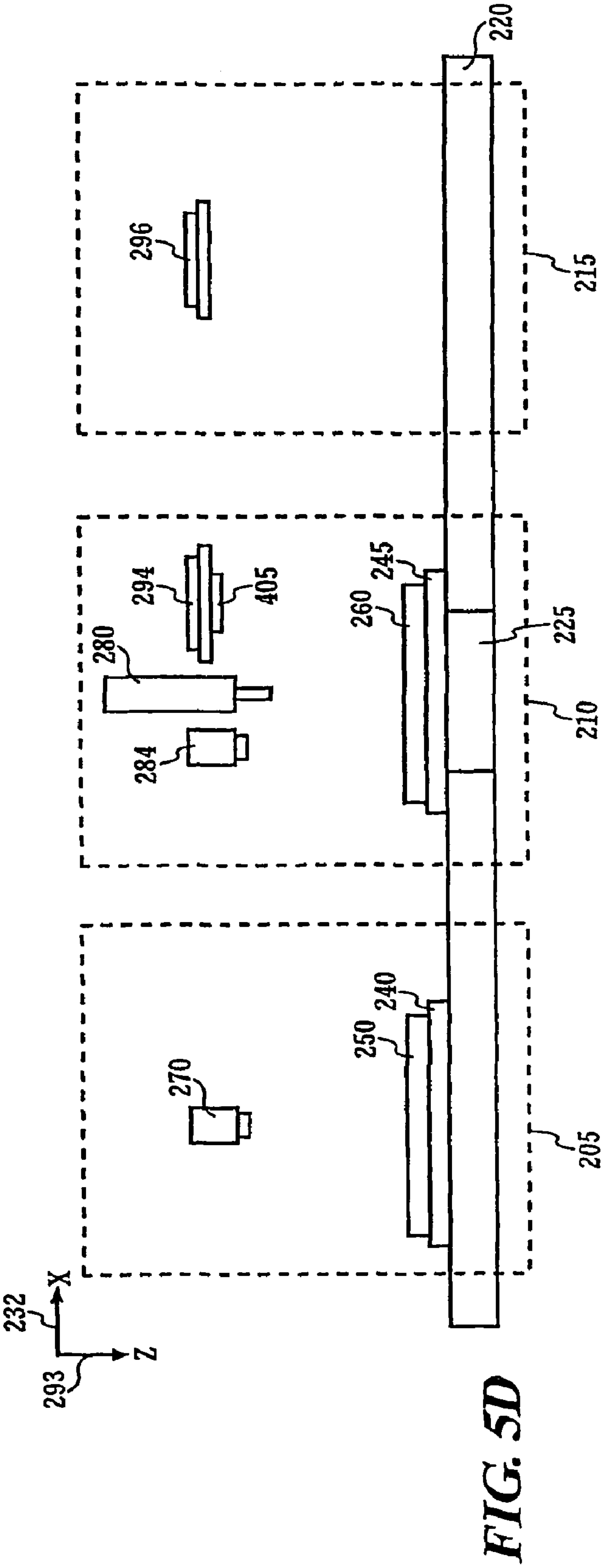

Referring to FIGS. 4D and 5D, the pick and place assembly 294 at the cutting location 210, then picks 330 the first molded substrate 405 off the first vacuum chuck 255 and holds on to it, while the first movable mount 240 moves 335 from the cutting location 210 back to the loading location 205, as indicated by arrow 430. At about the same time, the second movable mount 245 moves 335 from the unloading location 215 to the cutting location 210, as indicated by arrow 435.

Figure 4E:
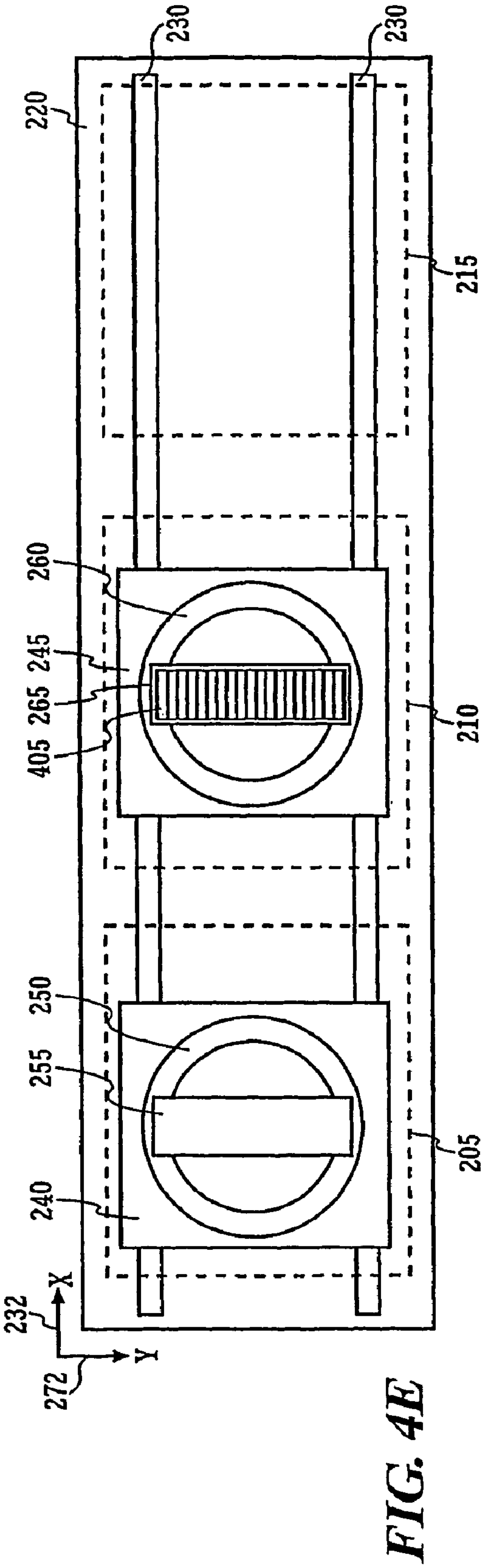
Figure 5E:
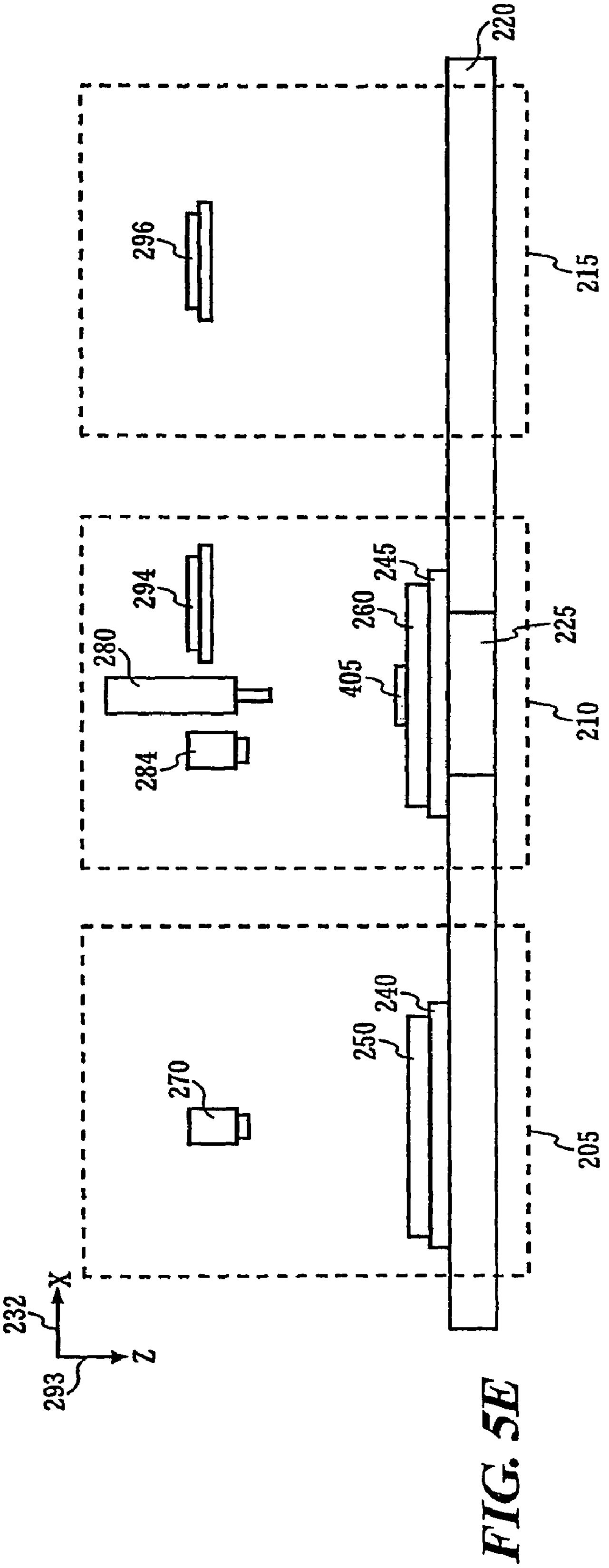

Referring to FIGS. 4E and 5E, the first molded substrate 405 is placed 340 on the second vacuum chuck 265 by the pick and place assembly 294, at the cutting location 210. The pick and place assembly 294 may rotate the first molded substrate 405 through a right angle prior to placing 340 the first molded substrate 405 on the second vacuum chuck 265. Alternatively, the second rotatable section 260 may rotate the first molded substrate 405 through a right angle, after the first molded substrate 405 is placed 340 on the second vacuum chuck 265. Next, a second vision alignment of the first molded substrate 405 is performed 345 at the cutting location 210 with images obtained from the video camera 284.

Figure 4F:
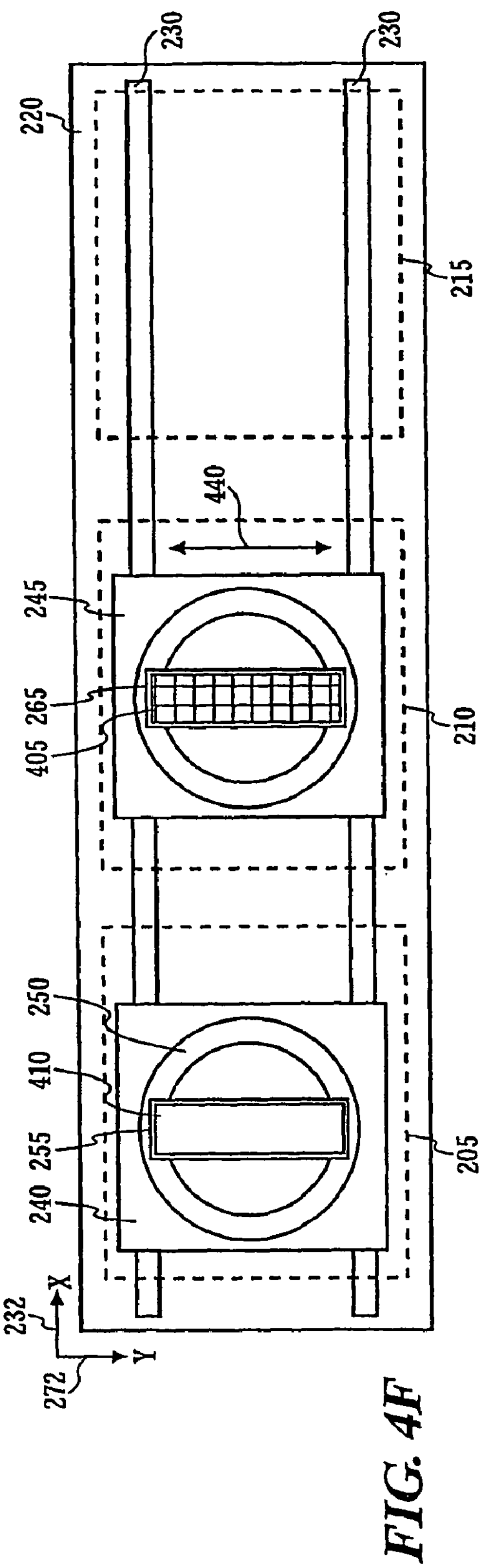
Figure 5F:
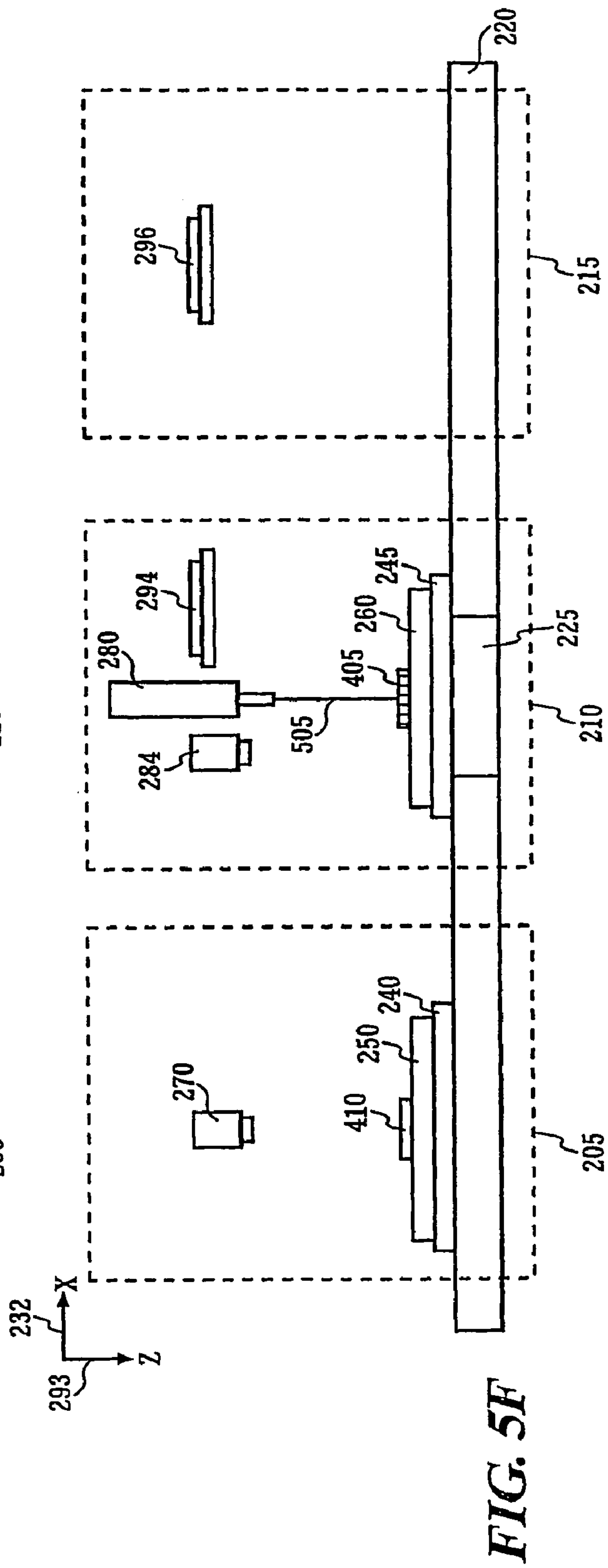

Referring to FIGS. 4F and 5F, at the cutting location 210, the water jet 505 cuts 350 the first molded substrate 405 length-wise, as the servomotor 290 moves the water jet nozzle 280 forward and backward across the first molded substrate 405 in the Y direction 272, as indicated by arrow 440. Here, the servomotor 290 moves the water jet 505 in the Y direction 272, and the second movable mount 245 steps in the X direction 232 until the whole of the first molded substrate 405 is cut lengthwise. The molded substrate 405 is now singulated, and the singulated semiconductor packages are secured to the second vacuum chuck 265.

Meanwhile, at the loading location 205, a second molded substrate 410 is loaded 310 on the first vacuum chuck 255, and a first vision alignment is performed 315 on the second molded substrate 410 with the images obtained from the first video camera 270.

Figure 4G:
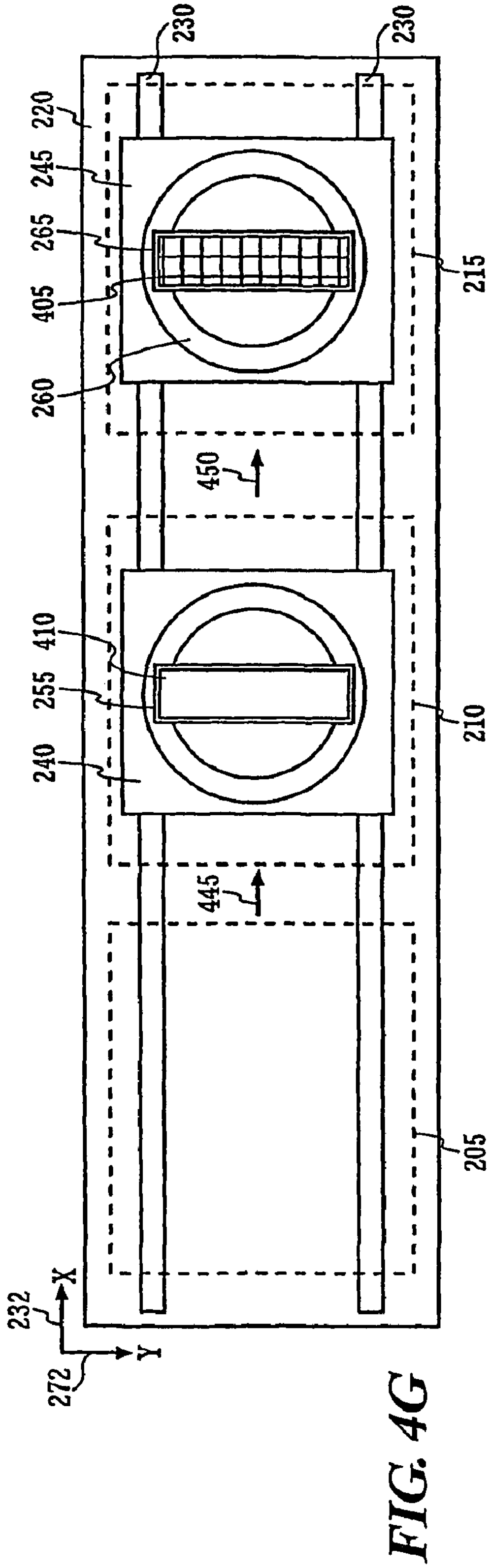
Figure 5G:
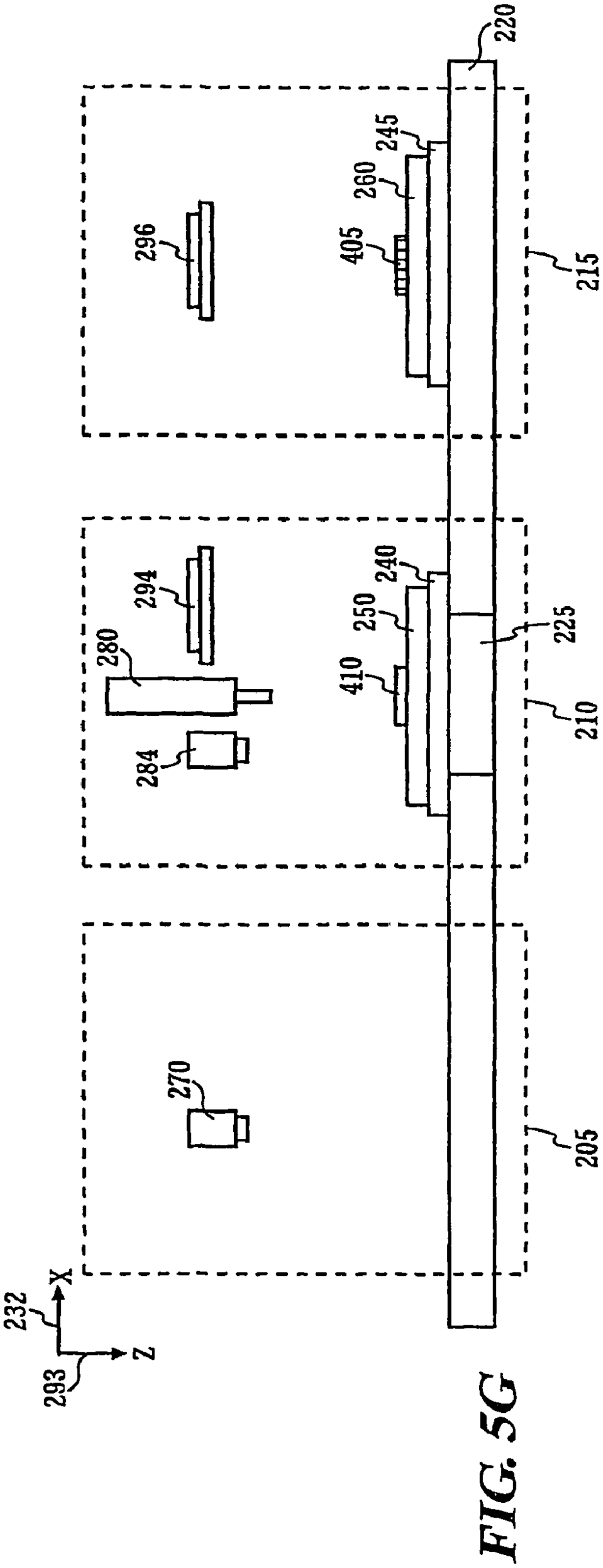

Referring to FIGS. 4G and 5G, the first movable mount 240 moves 320 from the loading location 205 to the cutting location 210, as indicated by arrow 445; and the second movable mount 245 moves 320 from the cutting location 210 to the unloading location 215, as indicated by arrow 450.

Figure 4H:
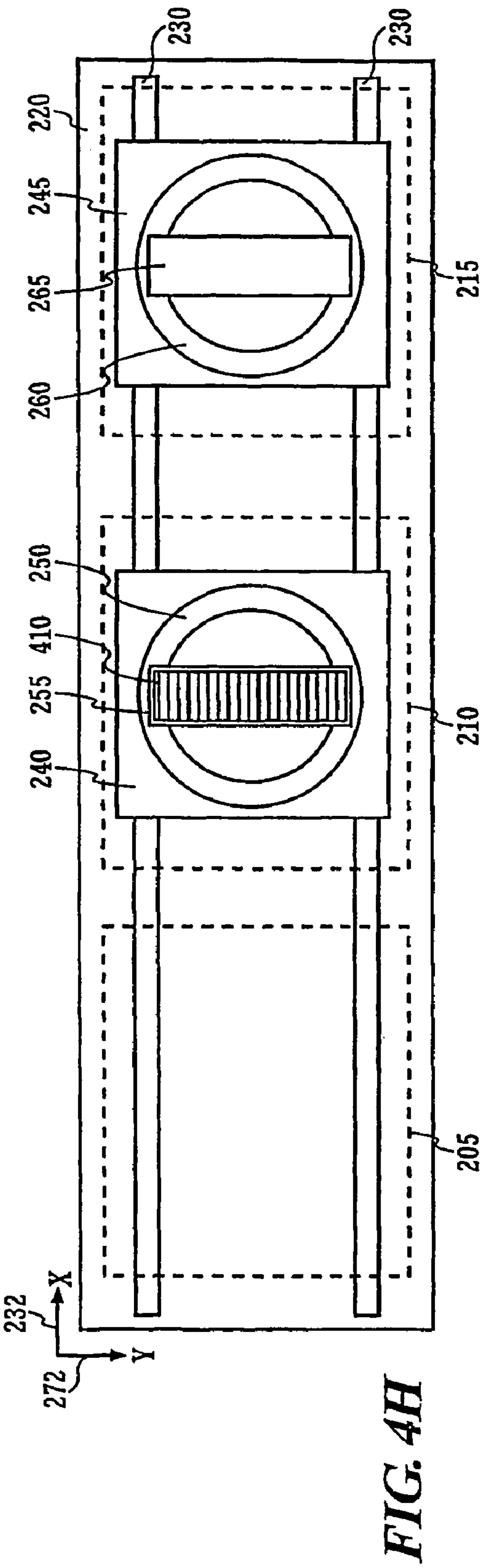
Figure 5H:
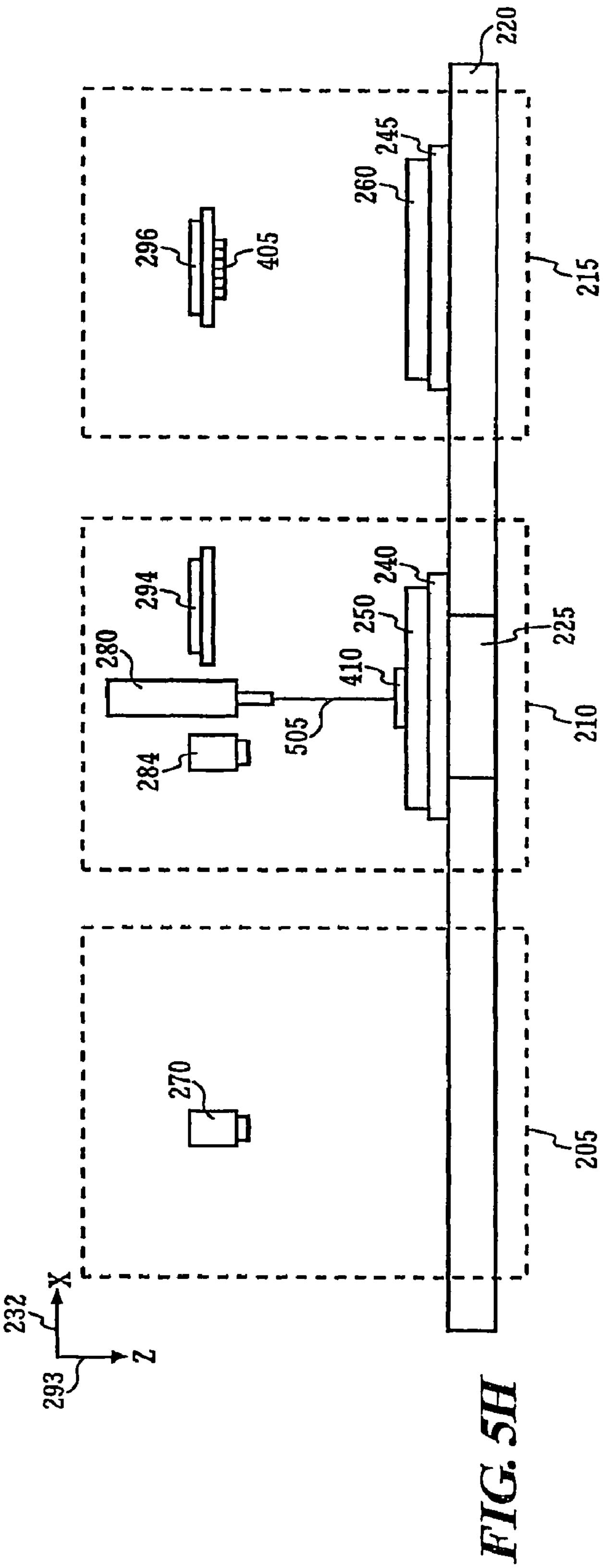

Referring to FIGS. 4H and 5H, at the unloading location 215, the singulated semiconductor packages of the first molded substrate 405 are picked off or unloaded 355 from the second vacuum chuck 265 by the second pick and place assembly 296. The second pick and place assembly 296, then disposes the singulated semiconductor packages of the first molded substrate 405 to, for example, a packing machine, such as a tape-and-reel packing machine.

At about the same time, at the cutting location 210, the water jet 505 cuts the second molded substrate 410 in the X direction 232, and the process 300 continues, as described earlier for each molded substrate.

Hence, the present invention, as described advantageously provides a water jet handler that has improved throughput, and is more easily integrated in in-line manufacturing operations.

This is accomplished by having a loading location; a cutting location; and an unloading location, with a first movable mount that moves between the loading location and the cutting location, and a second movable mount that moves between the cutting location and the unloading location. A molded substrate on the first movable mount is transported from the loading location to the cutting location and then cut in the X direction, while another molded substrate that was previously cut in the X direction at the cutting location, transferred to the second movable mount and cut in the Y direction at the cutting location, is transported to the unloading location and unloaded.

The two movable mounts advantageously allow concurrent operations to be performed on two molded substrates, with cutting performed at common cutting location.

In addition, separation of the loading and unloading locations allow the water jet handler to be more readily integrated into in-line manufacturing operations.

Thus, the present invention, as described provides a handler for semiconductor singulation and method therefor, which overcomes or at least reduces the abovementioned problems of the prior art.

It will be appreciated that although only a particular embodiment of the invention has been described in detail, various modifications and improvements can be made by a person skilled in the art without departing from the scope of the present invention.

The invention claimed is:

1. A method for cutting at least one packaged substrate, the method comprising:

a) providing:

a water jet cutting tool for supplying a water jet;

a first movable mount for moving between a loading location and a cutting location; and a second movable mount for moving between the cutting location and an unloading location;

b) moving the first movable mount from the loading location to the cutting location with the at least one packaged substrate disposed thereon;

c) while the at least one packaged substrate is disposed on the first movable mount, cutting the at least one packaged substrate in a first reference direction using the water jet supplied by the water jet cutting tool at the cutting location;

d) transferring the at least one packaged substrate from the first movable mount to the second movable mount at the cutting location;

e) while the at least one packaged substrate is disposed on the second movable mount, cutting the at least one packaged substrate in a second reference direction, the second reference direction being perpendicular to the first reference direction, using the water jet supplied by the water jet cutting tool at the cutting location to produce a plurality of packaged semiconductor devices; and f) moving the second movable mount from the cutting location to the unloading location for transporting the plurality of packaged semiconductor devices to the unloading location.

2. A method in accordance with claim 1 further comprising loading the at least one packaged substrate on the first movable mount.

3. A method in accordance with claim 1 further comprising unloading the plurality of packaged semiconductor devices from the second movable mount.

4. A method in accordance with claim 1 further comprising aligning the at least one packaged substrate on the first movable mount relative to the water jet cutting tool.

5. A method in accordance with claim 1 further comprising aligning the at least one packaged substrate on the second movable mount relative to the water jet.

6. A method in accordance with claim 1, further comprising:

determining a distance between the water jet cutting tool and the at least one packaged substrate; and displacing the water jet cutting tool relative to the at least one packaged substrate for adjusting the distance therebetween.

7. A method in accordance with claim 1 wherein (f) further comprises unloading the plurality of packaged semiconductor devices from the second movable mount at the unloading location.

8. A method in accordance with claim 1 wherein (c) further comprises moving the first movable mount in the first reference direction for facilitating cutting of the at least one packaged substrate in the first reference direction.

9. A method in accordance with claim 1 wherein (c) further comprises directing the water jet along the second reference direction for facilitating cuffing of the at least one packaged substrate along multiple parallel lines in the first reference direction.

10. A method in accordance with claim 1 wherein (e) further comprises rotating the packaged substrate on the second movable mount before moving the second movable mount in the first reference direction for facilitating cutting of the at least one packaged substrate.

11. A method in accordance with claim 1 wherein (e) further comprises moving the water jet in the second reference direction for facilitating cutting of the at least one packaged substrate in the second reference direction.

12. A method in accordance with claim 1, wherein (d) comprises:

picking the at least one packaged substrate off the first movable mount; and moving the first movable mount from the cutting location to the loading location, moving the second movable mount from the unloading location to the cutting location, and placing the at least one packaged substrate picked off the first movable mount onto the second movable mount.

13. An apparatus for cutting a packaged substrate comprising:

a set of transport guides having a length that extends in a first direction between a loading location, a cutting location, and an unloading location, the cutting location being disposed between the loading location and the unloading location;

a first movable mount coupled to the set of transport guides, the first movable mount comprising a first rotatable section;

a second movable mount coupled to the set of transport guides, the second movable mount comprising a second rotatable section;

a first gantry extending in a second direction and bridging at least a portion of the set of transport guides, the second direction being perpendicular to the first direction; and a water jet cutting tool coupled to the first gantry and displaceable therealong in the second direction at the cutting location.

14. The apparatus as in claim 13, wherein the first movable mount is displaceable along the set of transport guides between the loading location and the cutting location, the first movable mount receiving the packaged substrate at the loading location before being displaced along the set of transport guides for transferring the packaged substrate to the cutting location.

15. The apparatus as in claim 14, wherein a plurality of cuts are made through the packaged substrate in the first direction when the packaged substrate is disposed on the first movable mount.

16. The apparatus as in claim 15, wherein the second movable mount is displaceable along the set of transport guides between the cutting location and the unloading location, the second movable mount receiving the packaged substrate from the first movable mount at the cutting location.

17. The apparatus as in claim 16, wherein the second rotatable section rotates the packaged substrate disposed on the second movable mount for facilitating cutting thereof in the second direction.

18. The apparatus as in claim 17, wherein the water jet cutting tool comprises at least one water jet nozzle for supplying a water jet for cutting the packaged substrate in each of the first and second directions.

19. The apparatus as in claim 18, wherein the water jet comprises at least one abrasive material.

20. The apparatus as in claim 18, further comprising a distance detector mounted proximal the at least one water jet nozzle, the distance detector operable for determining a distance between the at least one water jet nozzle and the packaged substrate.

21. The apparatus as in claim 18, further comprising an actuator coupled to the at least one water jet nozzle, the actuator being operable for displacing the at least one water jet nozzle to thereby adjust the distance between the at least one water jet nozzle and the packaged substrate.

22. An apparatus for cutting a packaged substrate comprising:

a set of transport guides having a length that extends in a first direction between a loading location, a cutting location, and an unloading location, the cutting location being disposed between the loading location and the unloading location;

a first movable mount coupled to the set of transport guides, the first movable mount comprising a first rotatable section;

a first image capture device configured for capturing an image of the packaged substrate disposed on the first movable mount;

a second movable mount coupled to the set of transport guides, the second movable mount comprising a second rotatable section;

a first gantry extending in a second, the second direction being perpendicular to the first direction; and a water jet cutting tool coupled to the first gantry and displaceable therealong in the second direction at the cutting location.

23. The apparatus as in claim 22, further comprising a second image capture device for capturing an image of the packaged substrate disposed on the second movable mount.

24. The apparatus as in claim 13, further comprising a pick and place assembly configured to transfer the packaged substrate from the first movable mount to the second movable mount.

25. A method for singulating a packaged substrate comprising:

loading a packaged substrate onto a first movable mount at a loading location;

transferring the first movable mount to a cutting location;

cutting the packaged substrate in a first direction;

transferring the packaged substrate onto a second movable mount;

cutting the packaged substrate in a second direction; and transferring the second movable mount to an unloading location, wherein at least one of cutting the packaged substrate in the first direction and cutting the packaged substrate in the second direction is performed using a water jet while the packaged substrate is disposed on one of the first movable mount and the second movable mount.

26. The method as in claim 25, wherein each of cutting the packaged substrate in the first direction and cutting the packaged substrate in the second direction is performed at the cutting location.

27. The method as in claim 26, wherein the first direction and the second direction are orthogonal.

28. The method as in claim 27, further comprising:

adjusting a distance between the water jet cutting tool and the packaged substrate at the cutting location; and aligning the packaged substrate relative to the water jet cutting tool at the cutting location.

29. The method as in claim 28 wherein transferring the first movable mount to the cutting location and transferring the second movable mount to the unloading location occur in a generally simultaneous synchronized manner.

* * * * *

UNITED STATES PATENT AND TRADEMARK OFFICE

CERTIFICATE OF CORRECTION

PATENT NO. : 7,692,440 B2
APPLICATION NO. : 10/533236
DATED : April 6, 2010
INVENTOR(S) : Jimmy Hwee Seng Chew et al.

It is certified that error appears in the above-identified patent and that said Letters Patent is hereby corrected as shown below:

On column 9, line 62, of claim 9, please replace the word "cuffing" with the word "cutting" as shown below:

9. A method in accordance with claim 1 wherein (c) further comprises directing the water jet along the second reference direction for facilitating [[cuffing]] cutting of the at least one packaged substrate along multiple parallel lines in the first reference direction.

Signed and Sealed this

Third Day of August, 2010

David J. Kappos
*Director of the United States Patent and Trademark Office*